United States Patent [19]
Saitoh et al.

[11] Patent Number: 4,905,445
[45] Date of Patent: Mar. 6, 1990

[54] SYSTEM FOR ARRANGING CHIPS IN SERIES

[75] Inventors: Kenichi Saitoh; Osamu Kumagai; Yoshio Inomata, all of Akita, Japan

[73] Assignee: TDK Corporation, Japan

[21] Appl. No.: 168,000

[22] Filed: Mar. 14, 1988

[51] Int. Cl.$^4$ ............................................. G01R 31/00
[52] U.S. Cl. ......................................... 53/54; 53/131; 324/158 F
[58] Field of Search .................... 53/54, 77, 553, 545, 53/251, 131, 249; 324/158 F, 158 P, 158 R, 73 AT

[56] References Cited

U.S. PATENT DOCUMENTS

| | | | |
|---|---|---|---|
| 3,059,215 | 10/1962 | Proskauer | 324/158 F |
| 3,627,124 | 12/1971 | Hance et al. | 324/158 F X |
| 3,704,418 | 11/1972 | Coffin | 324/158 F |
| 4,053,065 | 10/1977 | Kowalski et al. | 53/154 X |
| 4,320,339 | 3/1982 | Vancelette | 324/158 F X |
| 4,437,229 | 3/1984 | Bitler et al. | 324/158 F X |

Primary Examiner—James F. Coan
Attorney, Agent, or Firm—Steinberg & Raskin

[57] ABSTRACT

A system for arranging chips in series in a tape capable of automatically and efficiently carrying out all steps from the feeding of chips to the arranging of them in series in recesses of a tape with high reliability. The system includes a chip feed section adapted to individually separate chips and automatically eliminate a chip defective in configuration while supplying chips, a first intermittently turned index table formed with chip receiving grooves for successively receiving chips one by one from the chip feed section and adapted to automatically eliminate a chip defective in electrical characteristics, and a chip transferring section for transferring chips from the first index table to a second intermittently turned index table. The second index table is formed with chip receiving grooves for successively receiving chips one by one from the chip transferring section. Chips are then taken out and arranged in recesses of an intermittently moving tape one by one by a suction pin. Around the first index table are arranged a chip measuring section for measuring electrical characteristics of a chip and a chip marking section for putting a mark or a value of measured electrical characteristics on a chip.

14 Claims, 20 Drawing Sheets

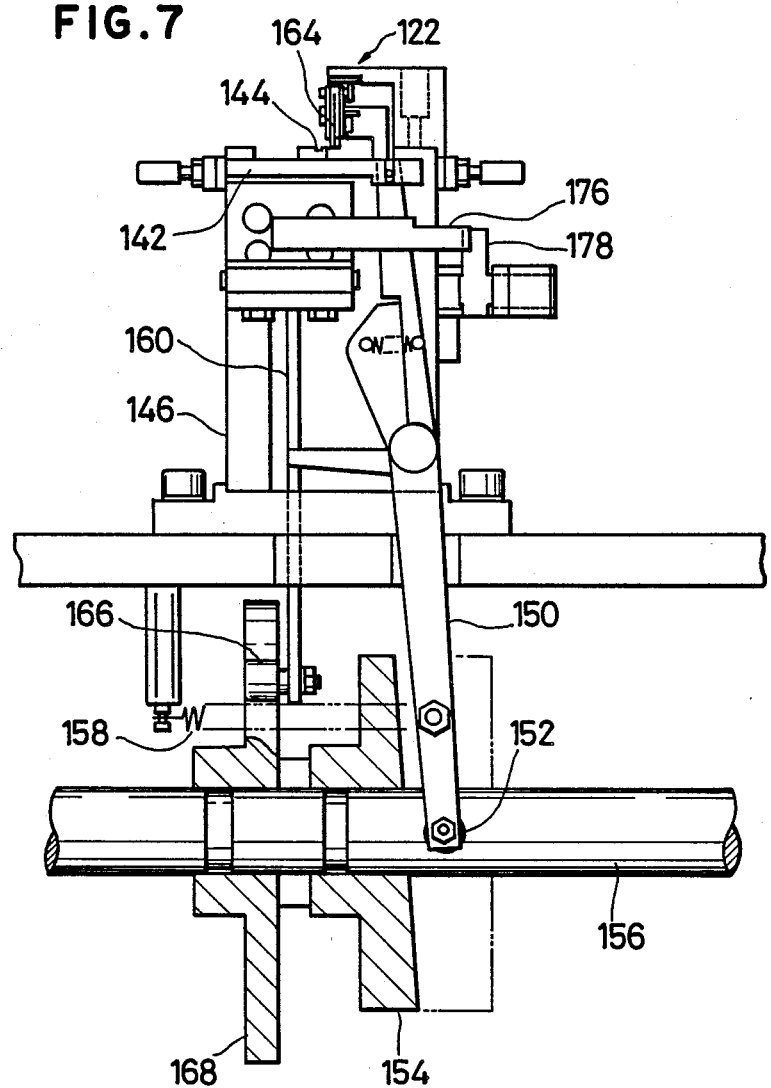

SYSTEM FOR ARRANGING CHIPS IN SERIES

BACKGROUND OF THE INVENTION

1. Field of the Invention

This invention relates to a system for arranging electronic and/or electric chip-type circuit elements in series, and more particularly to a system for arranging chip-type circuit elements in series in a tape which is adapted to automatically carry out measurement of electrical characteristics of each of the chip-type circuit elements, application of a mark on each of the circuit elements and arrangement of the circuit elements in series in a tape in order.

2. Description of the Prior Art

In general, mounting of an electronic and/or electric chip-type circuit element (hereinafter referred to as "chip") such as a chip capacitor, a chip resistor or the like on a printed circuit board is automatically practiced by means of a chip mounting machine and supplying of chips to such a chip mounting apparatus is carried out using an embossed tape which has a series of chips received in embosses or recesses thereof and covered with a cover tape or a bored paper tape which has a series of chips inserted in bores thereof and covered on both upper and lower sides of the bored tape with cover tapes.

Conventionally, in formation of a series of chips which are to be fed to a chip mounting apparatus, measurement of electrical characteristics of each of the chips such as electrostatic capacity, resistance, inductance or the like, putting of a mark on each of the chips after the measuring, and arrangement of chips in series in a tape after the application are accomplished by means of the respective exclusive apparatus.

When carrying out each of the above-described steps with an exclusive apparatus, it is required to manually carry out storaging of chips in and supplying of chips to an exclusive apparatus every time each of the steps is completed. Also, the conventional system fails to satisfactorily deal with a defective chip.

For example, a chip feed apparatus or section which has been conventionally used for arranging chips in series includes a laterally moved separation member which has an alignment groove formed thereon so as to arrange chips in a row therein and a separation groove formed thereon so as to be connected to a tip end of the alignment groove, as typically disclosed in Japanese Utility Model Application Laying-Open Publication No. 81094/1984. The separation member is adapted to separate chips fed through the alignment groove one by one. However, the conventional chip feed apparatus has a disadvantage that when any defective chip which is defective in, for example, configuration, is included in the chips, it fails to remove or eliminate the defective chip, resulting in an interruption.

Further, in arrangement of chips in series, it is required to pay careful attention to prevent any defect such as breakage, damage or the like from occurring to a chip. However, the conventional system fails to effectively prevent occurrence of such defects.

Accordingly, it would be highly desirable to develop a system for arranging chips in series which is capable of automatically carrying out steps required for the arrangement of chips in series substantially without interruption, automatically removing a defective chip from an arrangement line and preventing any defect from occurring in a chip.

SUMMARY OF THE INVENTION

Generally speaking, in accordance with the present invention, a system for arranging chips in series is provided. The system includes a first index table of a disc-like shape intermittently turned and formed with a plurality of chip receiving grooves at equal intervals, to which chips are supplied one by one from a chip feed section. Around the first index table is arranged a chip measuring and marking mechanism which is adapted to measure electrical characteristics of each of the chips successively carried by the first index table intermittently turned and then put a mark or indication of the chip. The system also includes a second index table of a disk-like shape intermittently turned and formed with a plurality of chip receiving grooves at equal intervals. Between the first index table and the second index table is arranged chip transferring means to connect the first index table to the second index table to successively transfer normal chips delivered from the first index table to the second index table. Chips carried by the second index table are successively taken out by a chip arranging section utilizing vacuum suction. The chip arranging section then arranges the chips in series in a tape.

In a preferred embodiment of the present invention, the chip feed section comprises a linear feeder formed with an aligning groove for arranging a plurality of chips fed from a chip source in a row, a separation slider formed with a separation groove for individually separating chips which is connected to the aligning groove when the separation slider is in a state capable of accepting a chip, an insertion guide formed with a guide groove which is connected to the separation groove of the separation slider when the slider is in a state capable of individually separating chips, a pusher for pushing out a chip received in the separation groove to the guide groove, and a suction pin for eliminating a chip defective in configuration by vacuum suction when the defective chip is placed in the separation groove to interfere with movement of the separation slider.

In a preferred embodiment of the present invention, the chip measuring and marking mechanism comprises a chip measuring section which is adapted to measure electrical characteristics of each of the chips carried by the first index table and a chip marking section which is adapted to put a mark or indication on a chip measured at the measuring section. Both sections are arranged around the first index table. The first index table includes push rods slidably arranged on the first index table so as to be slidable in a radial direction of the table, resulting in that a chip defective in electrical characteristics detected at the measuring section may be eliminated by action of each of the push rods at a position which is not associated with the chip transferring means.

In a preferred embodiment of the present invention, the chip arranging section comprises a photosensor for detecting the location of each of the chips delivered from the chip transferring means in each of the chip receiving grooves of the second index table, a vertically movable arm lowered when the second index table is stopped, a suction pin mounted on a tip end of the vertically movable arm for holding chips thereon in turn by suction and arranging them in the tape, and a pitch feed wheel for intermittently transferring the tape.

Accordingly, it is an object of the present invention to provide a system for arranging chips in series which is capable of efficiently arranging chips in series in a tape with high reliability It is another object of the present invention to provide a system for arranging chips in series which is capable of automatically carrying out steps required for formation of a series of chips.

It is a further object of the present invention to provide a system for arranging chips in series which is capable of automatically removing or eliminating any defective chip from the system.

It is still another object of the present invention to provide a system for arranging chips in series which is capable of accomplishing labor saving in the arrangement operation and carrying out the operation with high efficiency.

It is yet another object of the present invention to provide a system for arranging chips in series which is capable of effectively preventing any defect from occurring in chips during the arrangement operation.

It is still a further object of the present invention to provide a chip feed apparatus which is capable of accomplishing labor saving and an improvement in efficiency in the chip feeding operation.

It is yet a further object of the present invention to provide a chip measuring and marking apparatus which is capable of accomplishing labor saving and an improvement in efficiency in the chip measuring and marking operations.

It is an even further object of the present invention to provide a chip arranging apparatus which is capable of effectively preventing any defect from occurring in chips during the arrangement operation.

Still other objects and advantages of the invention will be apparent from the specification.

The invention accordingly comprises the features of construction, combination of elements, and arrangement of parts which will be exemplified in the construction hereinafter set forth.

BRIEF DESCRIPTION OF THE DRAWINGS

For a fuller understanding of the invention, reference is had to the following description taken in connection with the accompanying drawings in which like reference numerals designate like parts throughout; wherein:

FIG. 7 is a front elevation view partly in section showing a chip separating mechanism;

DETAILED DESCRIPTION OF THE PREFERRED EMBODIMENTS

Now, a system for arranging chips in series according to the present invention will be described hereinafter with reference to the accompanying drawings.

Figure 1:
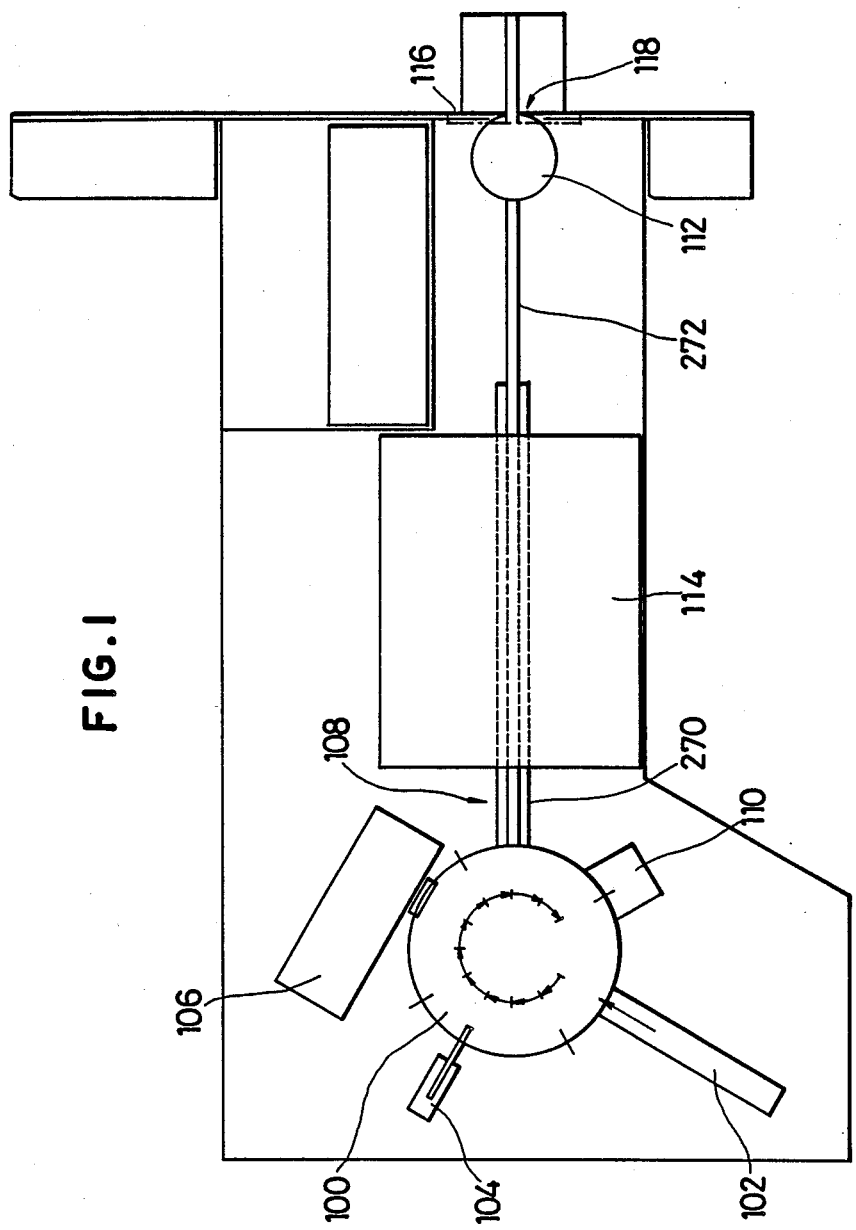
FIGS. 1 and 2 are a schematic plan view and a schematic perspective view each showing a general structure of an embodiment of an apparatus for arranging chips in series according to the present invention.
Figure 2:
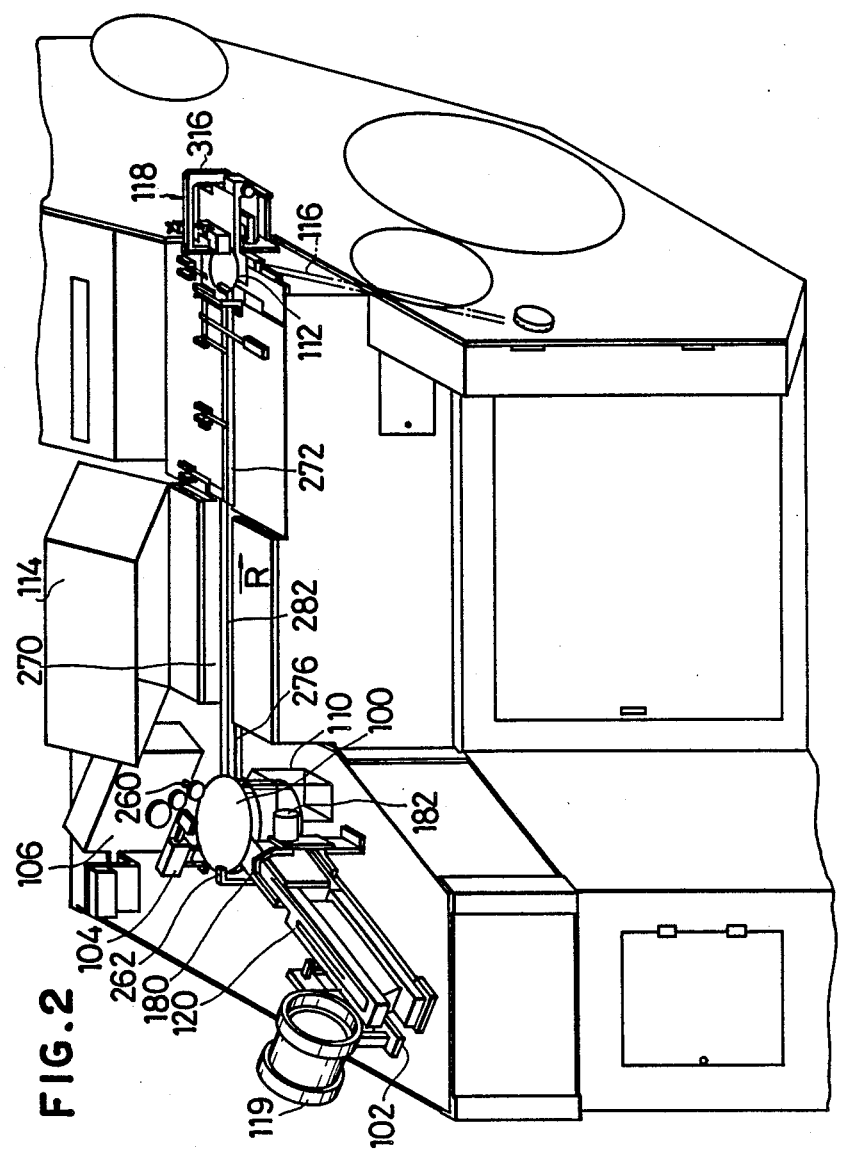

FIGS. 1 and 2 show a general structure of an embodiment of a system according to the present invention.

As shown in FIGS. 1 and 2, a system of the illustrated embodiment generally includes a first index table 100, around which a chip feed section or apparatus 102, a chip measuring section or apparatus 104, a chip marking section or apparatus 106, a chip transferring section or apparatus 108 and a defective chip receiver 110 are arranged in order. The first index table 100 is formed into a disc-like shape and adapted to be intermittently rotated or turned at a predetermined cycle. The chip feed section or apparatus 102 is adapted to feed chips to the index table 100 one by one and the chip measuring section 104 serves to measure electrical characteristics of chips such as, for example, electrostatic capacity of a chip capacitor, resistance of a chip resistor, inductance of a chip inductor and the like. The chip marking section 106 is adapted to put a mark or a value of such electrical characteristics of chips as described above on the chips. The chip measuring section 104 and chip marking section 106 constitute a chip measuring and marking mechanism in the system of the present invention. The chip transferring section or means 108 serves to transfer chips of normal electric characteristics to a subsequent step such as a drying step. The defective chip receiver 110 is so arranged that chips defective in electrical characteristics or the like are received therein.

Also, the system of the illustrated embodiment includes a second index table or taping index table 112 arranged in a manner to be spaced from the first index table 100. The above-described chip transferring section 108 is arranged between the first index table 100 and the second index table 112. Above a part of the chip carrying section 108 is arranged a drying section 114 for drying a mark put on a chip at the chip marking section 106.

Reference numeral 116 designates a tape which is formed with recesses or bores in series at equal intervals so as to receive chips therein and adapted to intermittently travel in proximity to the second index table or taping index table 112. Arranged adjacent to the taping index table 112 is a chip taping or arranging section or apparatus 118 for arranging chips carried by the taping index table 112 in the recesses of the tape 116 in series by vacuum suction. For this purpose, the chip taping or arranging section 118 is provided with vacuum suction means, which, in the illustrated embodiment comprises a suction pin as described hereinafter. In the embodiment, the second index table or taping index table 112 may constitute a part of the chip taping section 118.

Figure 3:
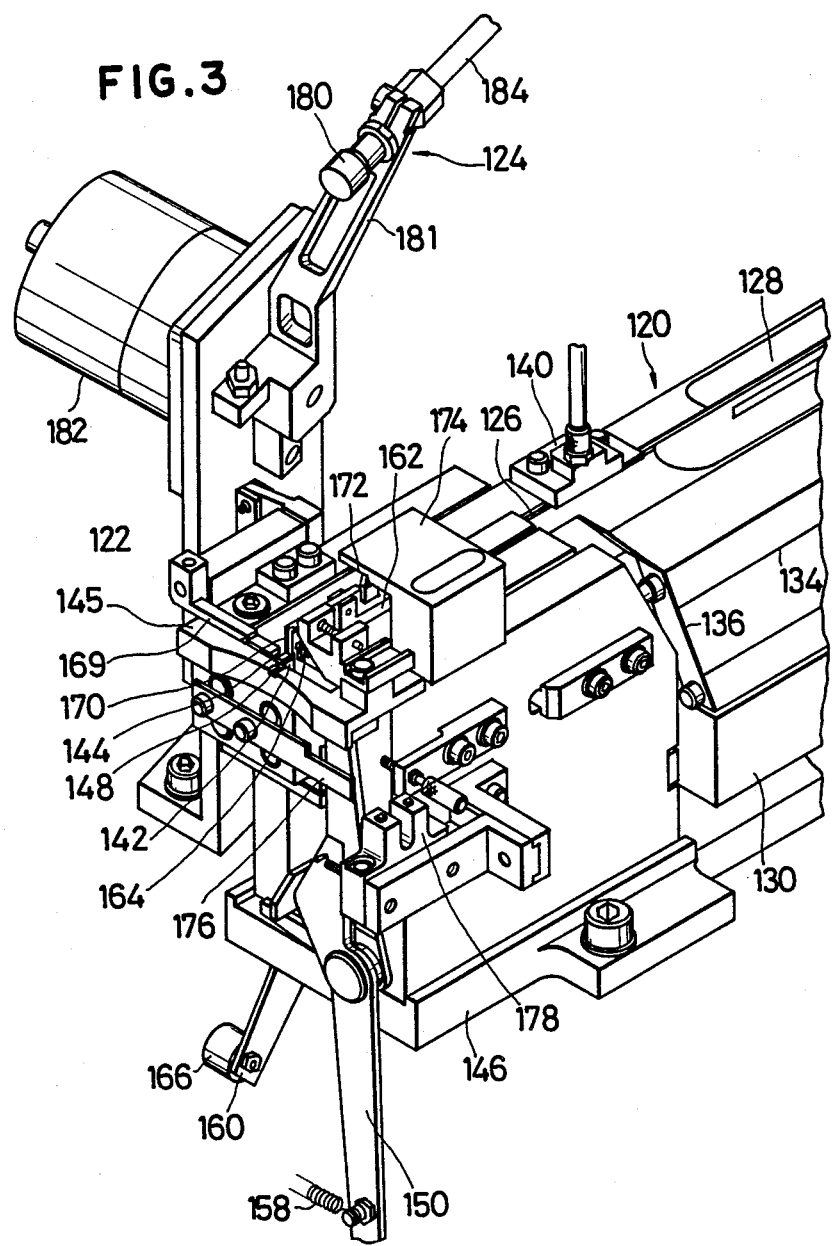
FIG. 3 is a fragmentary perspective view showing a linear feeder, a chip separating mechanism and a defective chip removing or eliminating mechanism which constitute a chip feed section or apparatus in the embodiment of FIGS. 1 and 2.

The chip feed section or apparatus 102, as shown in FIGS. 2 and 3, includes a chip bowl 119 which receives a number of chips therein so as to act as a chip source, a linear feeder 120 formed thereon with an aligning groove 126 for arranging chips supplied from the chip bowl 119 therein in a row, a chip separating mechanism 122 arranged facing a tip end of the linear feeder 120 so as to individually separate chips and detect a chip defective in configuration or shape, and a defective chip removing or eliminating mechanism 124 for eliminating a chip defective in configuration from the system.

Figure 4:
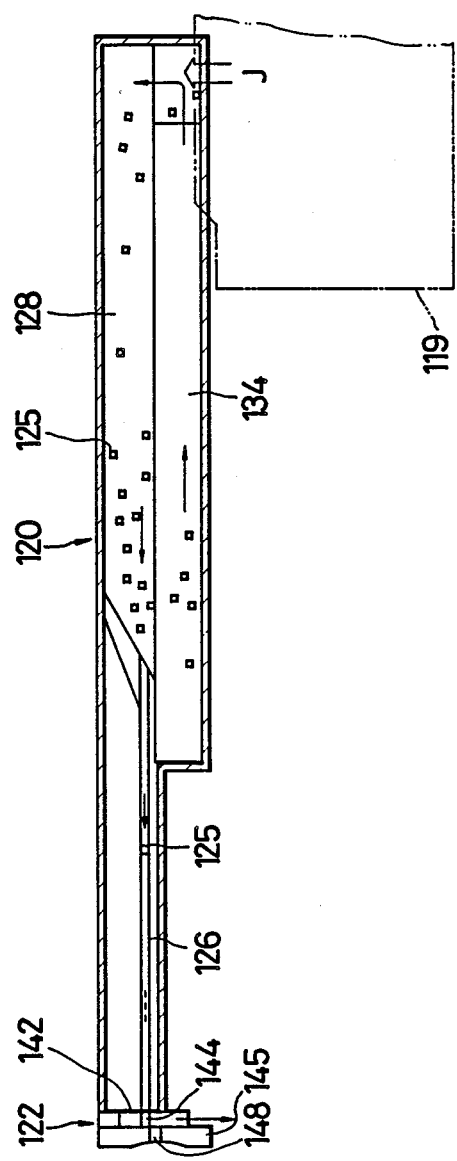
FIG. 4 is a schematic plan view showing a linear feeder of which a cover is removed.
Figure 5:
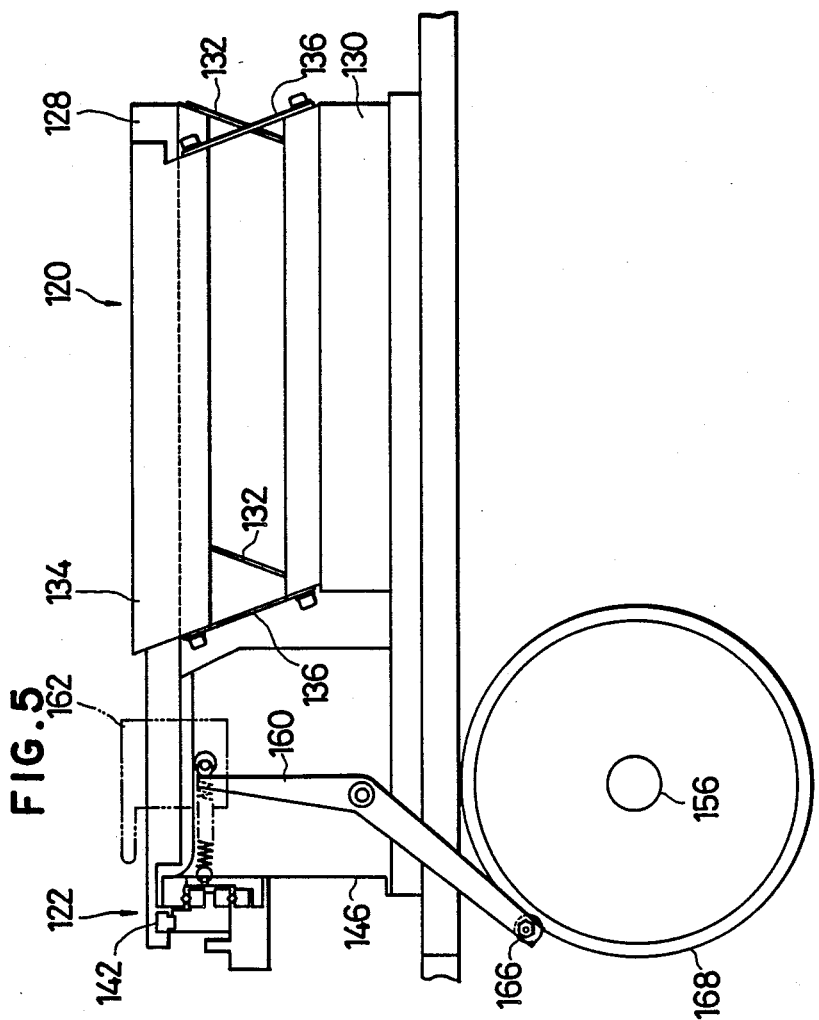
FIG. 5 is a side elevation view showing a linear feeder and a chip separating mechanism.

The chip bowl 119 is adapted to feed chips to the linear feeder 120 so that a predetermined number of chips may be constantly received or stored in the linear feeder 120. The linear feeder 120, as shown in FIGS. 4 and 5, serves to advance chips 125 due to vibration to arrange them in the aligning groove 126 in a row, to thereby supply them to the chip separating mechanism 122. For this purpose, the linear feeder 120 includes an advance vibration rack 128 supported above a base 130 by means of leaf springs 132 and connected to the aligning groove 126 of the chip separating mechanism 122 and a return vibration rack 134 above the base 130 through leaf springs 136. The advance vibration rack 128 serves to gradually advance chips 125 by vibration to feed them to the aligning groove 126, whereas the return vibration rack 134 acts to return excessive chips failing to be received in the aligning groove 126 to a rear portion of the advance vibration rack 128 to which chips 125 are supplied from the chip bowl 119 as indicated at an arrow J in FIG. 4. The vibration racks 128 and 134 each are provided with electromagnet means (not shown) which is adapted to be excited through an AC power supply to apply vibration thereto.

Figure 6:
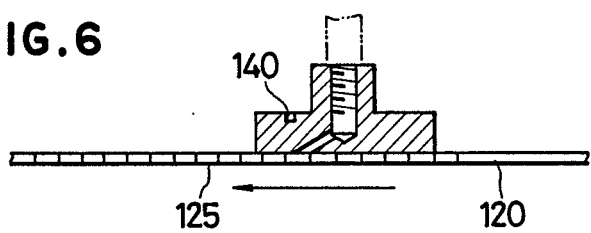
FIG. 6 is a fragmentary right-side elevation view in section showing an air jet nozzle.

The chip feed section or apparatus 102 utilizes an air jet for smoothly and effectively advancing chips in the aligning groove 126. More particularly, as shown in FIGS. 3 and 6, an air jet nozzle 140 is arranged on a ceiling portion of the linear feeder 120 so that an air jet may be blown against chips 125 in a direction of advance thereof. This results in applying further motive force to the linear feeder, to thereby forcedly push out a frontmost chip in the groove 126 to the chip separating mechanism 122 even when continuity of chips is interrupted.

The chip separating mechanism 122 briefly described above is detailedly shown in FIGS. 3, 5, 7 and 8. It includes a separation slider 142 formed with a separation groove 144 which is adapted to be connected to the aligning groove 126 of the linear feeder 120 when the slider 142 is at a state capable of accepting a chip 125 therein. The separation slider 142 is slidably arranged in a direction perpendicular to the aligning groove 126 of the linear feeder 120. The separation mechanism 122 also includes an insertion guide 145 which is fixed on a frame 146 of the mechanism 122 and formed with a guide groove 148. The guide groove 148 is so arranged that it may be connected to the separation groove 144 of the separation slider 142 when slider 142 is slid to individually separate chips.

Figure 10:
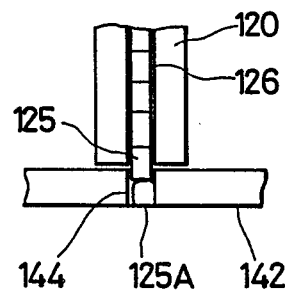

In the illustrated embodiment, as shown in FIG. 10, the aligning groove 126 of the linear feeder 120 for arranging chips 125 in a row therein is formed to have substantially the same width as the separation groove 144 of the separation slider 142 and the separation groove 144 is formed to have a length substantially equal to a length of a chip 125 having a normal shape. The separation groove 144 of the slider 142 is connected to the aligning groove 126 of the linear feeder 120 before the separation slider 142 is slid or when it is at a state capable of accepting a chip 125 therein and connected to the guide groove 148 of the insertion guide 145 after the slider 142 is slid or chip separation is carried out.

Figure 8:
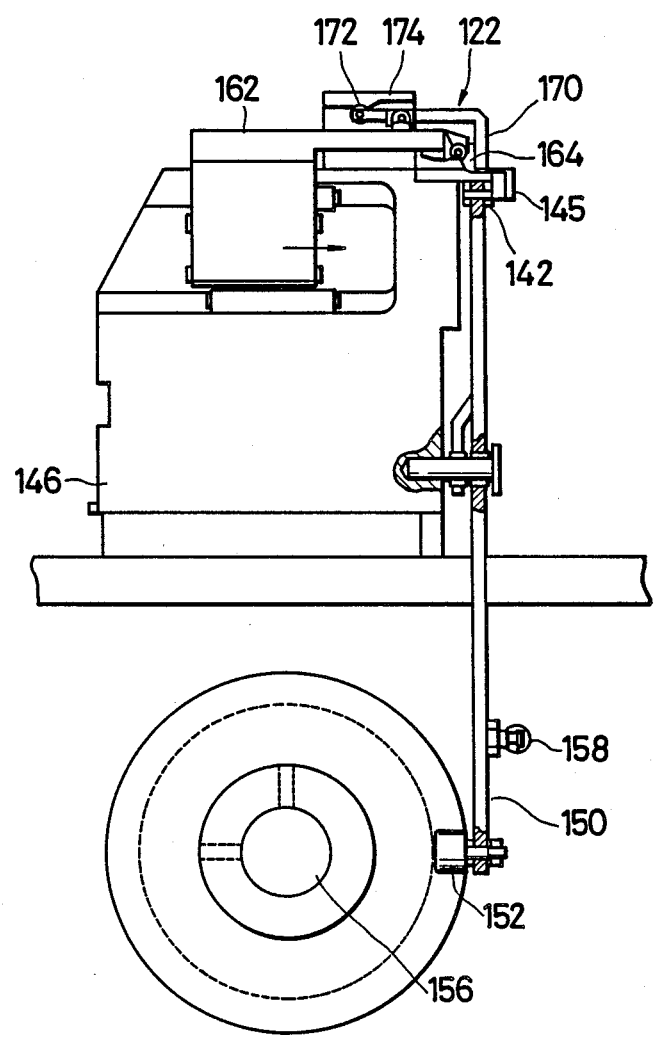
FIG. 8 is a left-side elevation view partly in section showing a chip separating mechanism.

Further, the chip separating mechanism 122 includes a separation lever 150 pivotally mounted on a front surface of the frame 146. The separation lever 150 is connected at an upper end thereof to the separation slider 142 as shown in FIGS. 7 and 8 and provided at a lower end thereof with a roller 152 which is adapted to be abutted against a cam 154 fixed on a rotating shaft 156. Between the frame 146 and the separation lever 150 is arranged an expansion spring 158 which serves to forcedly contact the roller 152 with the cam 154.

On the frame 146 is also pivotally mounted a pusher lever 160 as shown in FIG. 5, which is connected at an upper end thereof to a pusher slider 162 (FIGS. 3 and 8) slid in a direction parallel to the linear feeder 120. Mounted on a tip end of the slider 162 is a pusher 164, which is adapted to push out a chip of a normal shape separated at the separation groove 144 of the separation slider 142 toward the guide groove 148 of the insertion guide 145. On a lower end of the pusher lever 160 is mounted a roller 166, which is adapted to be abutted against a cam 168 fixed on the rotating shaft 156 as shown in FIGS. 5 and 7.

In the illustrated embodiment, a shutter 169 is provided in order to prevent a chip received in the separation groove 144 from being raised therefrom.

Also, in the embodiment, as shown in FIGS. 3 and 8, a holding lever 170 is pivotally supported on the pusher slider 162 for the purpose that when the pusher 164 pushes a chip separated at the separation slider 142, the chip is prevented from being raised. On a rear end of the holding lever 170 is fixed a roller 172, and a cam 174 is fixed on the frame 146 so that it may be abutted against the roller 172. Thus, the holding lever 170 is raised at a tip end thereof when the pusher slider 162 is moved to its retracted position or the pusher 164 is moved to its retracted position, resulting in preventing the lever 170 from interfering with the chip separating operation of the separation slider 142.

Figure 9:
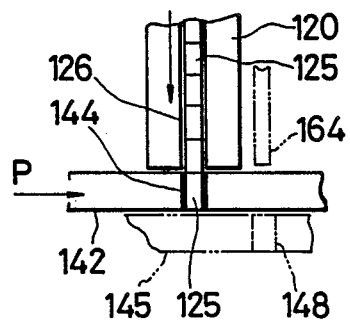
FIGS. 9 and 10 each are a schematic view showing operation of a chip separating mechanism.

FIGS. 9 and 10 show a principle of the chip separating operation of the separation slider 142. When chips 125 supplied to the separation slider 142 by the linear feeder 120 each have a normal shape, they are snugly or fittedly received in the separation groove 144. Then, the separation lever 150 is pivotally moved to cause the separation slider 142 to be slid in a direction indicated at an arrow P in FIG. 9. This results in one chip 125 being separated from chips 125 in the linear feeder.

When any chip defective in configuration such as a chip departing from a normal shape, a heterogeneous chip or a chip different in type, a chip having any defect such as breakage or the like is included in the chips supplied to the separation slider 142, a chip 125 next to the defective chip 125A partially enters the separation groove 144 together with the defective chip 125A to interfere with movement of the separation slider 142, as shown in FIG. 10.

Figure 11:
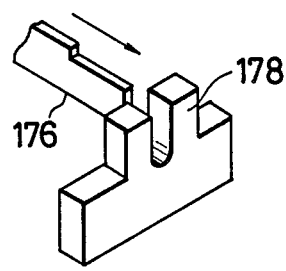
FIG. 11 is a perspective view showing a separation detecting sensor provided in a chip separating mechanism.

In order to detect such interference, the chip separating mechanism 122 is provided with a detecting bar 176 which integrally moves with the slider 142 and a separation detecting sensor 178 such as a proximity sensor fixed on the frame 146, as shown in FIGS. 3 and 11.

Figure 12:
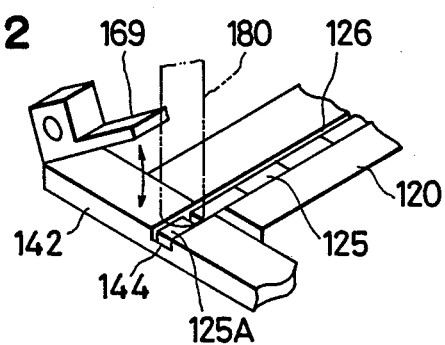
FIG. 12 is a fragmentary perspective view showing operation of a defective chip removing or eliminating mechanism.

As can be seen from the above description in connection with FIG. 9, a chip defective in configuration interferes with actuation of the separation slider 142 to interrupt the chip separating operation. The defective chip removing or eliminating mechanism or means 124 briefly described above is provided in order to eliminate such interference as shown in FIG. 3. The defective chip eliminating means or mechanism 124 includes a recovery suction pin 180 mounted on a tip end of an arm 181 pivotally moved by a motor 182 fixedly mounted on the frame 146. When the separation detecting sensor 178 detects a failure in the chip separating operation by the separation slider 142, the motor 182 is driven to lower the suction pin 180 of the defective chip removing mechanism 124 onto the separation groove 144 released from the shutter 169 as shown in FIG. 12, so that the suction pin 180 may take out the defective chip 125A from the separation groove 144 by vacuum suction. Then, the arm 181 is pivotally moved by about 270 degrees to eliminate the defective chip. In the embodiment, the suction pin 180 is connected through a vacuum suction hose 184 to a vacuum pump (not shown).

Now, the manner of operation of the chip feed section or apparatus constructed as described above will be briefly described.

Figure 13A:
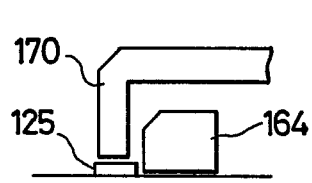
FIG. 13A and 13B each are a schematic view showing operation of a pusher provided in a chip separating mechanism.
Figure 13B:
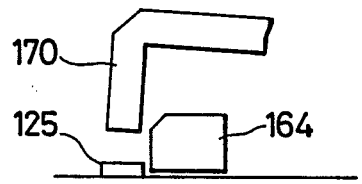

Chips 125 received in the chip bowl 119 are supplied to the linear feeder 120, which then supplies the chips to the separation groove 144 formed on the separation slider 142 of the chip separating mechanism 122. When the chips are normal, the separation slider 142 is permitted to be moved in the direction of the arrow P as shown in FIG. 9 to separate one chip from the chips and connect the separation groove 144 to the guide groove 148 of the insertion guide 145. The separated chip 125 is forcedly pushed into the guide groove 148 by the pusher 164 while being held by the holding lever 170 as shown in FIG. 13A. Thus, the chips 125 are delivered through the guide groove 148 to the index table 100 one by one. The holding lever 170 is raised at a tip end thereof as shown in FIG. 13B when the pusher 164 is moved to the retracted position, i.e., the standby position. This results in preventing the lever 170 from interfering with movement of the next chip.

Supply of a chip defective in configuration to the separation groove 144 leads to a failure in sliding movement of the separation slider 142 as shown in FIG. 10. This is detected due to the fact that the detection bar 176 fails to approach to the separation detecting sensor 178, as shown in FIG. 11. This causes the shutter 169 which covers the separation groove 144 to be opened and the motor 182 to be driven to lower the recovery suction pin 180, so that the suction pin 180 may hold the defective chip 25A thereon by suction for elimination of the chip 125A. This permits the next normal chip to be separated and delivered to the guide groove of the insertion guide 145.

As can be seen from the foregoing, the chip feed section or apparatus constructed as described above which is incorporated in the system of the illustrated embodiment includes the linear feeder for arranging a plurality of chips supplied from the chip supply source in the aligning groove of the linear feeder in a row, the separation slider formed with the separation groove adapted to be connected to the aligning groove when it is at a state capable of accepting a chip therein, the insertion guide formed with the guide groove which is adapted to be connected to the separation groove when the separation slider is at a state capable of separating a chip, the pusher for pushing out the chip received in the separation groove, and the suction pin for removing a chip defective in configuration by suction when the defective chip is positioned in the separation groove to cause the separation slider to fail in sliding movement. Thus, the chip feed apparatus effectively and automatically remedies a failure in separation of the chips due to a chip defective in configuration to minimize or substantially eliminate monitoring and maintenance of the apparatus, resulting in labor saving and an improvement in the reliability of the operation.

Now, the chip measuring and marking mechanism or the chip measuring section 104 and chip marking section 106 schematically shown in FIGS. 1 and 2 will be detailedly described hereinafter with reference to FIGS. 14 to 19.

Figure 14:
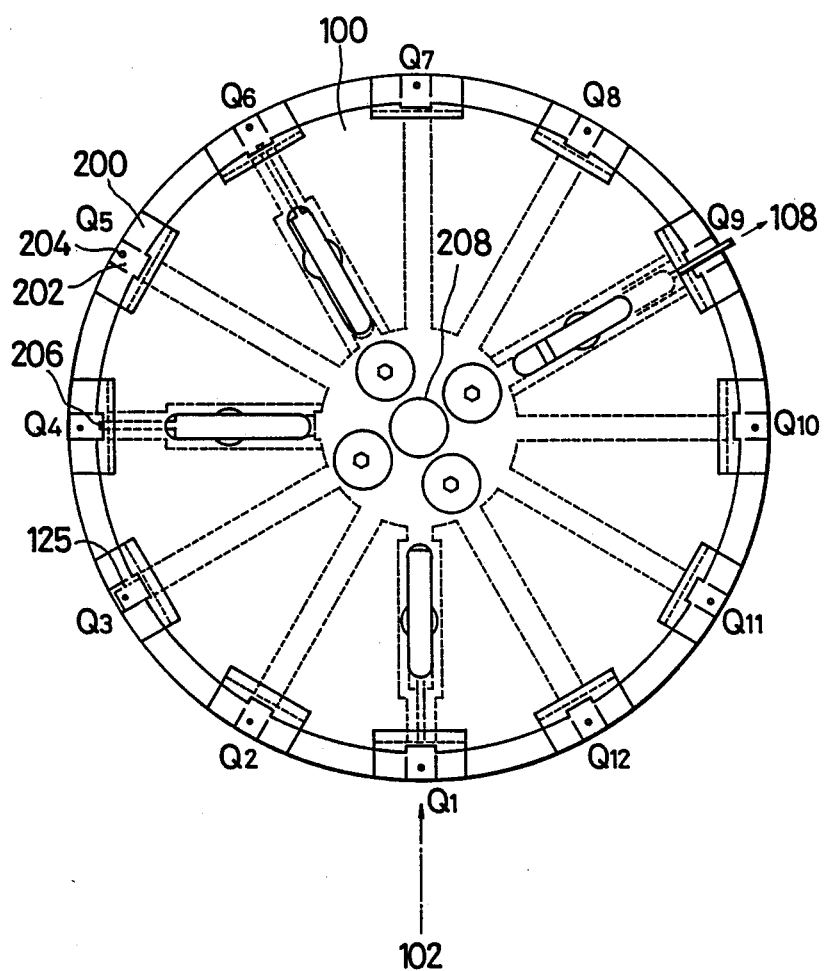
FIG. 14 is a plan view showing a first index table or an index table for a chip marking section or apparatus incorporated in the system shown in FIG. 1.
Figure 15:
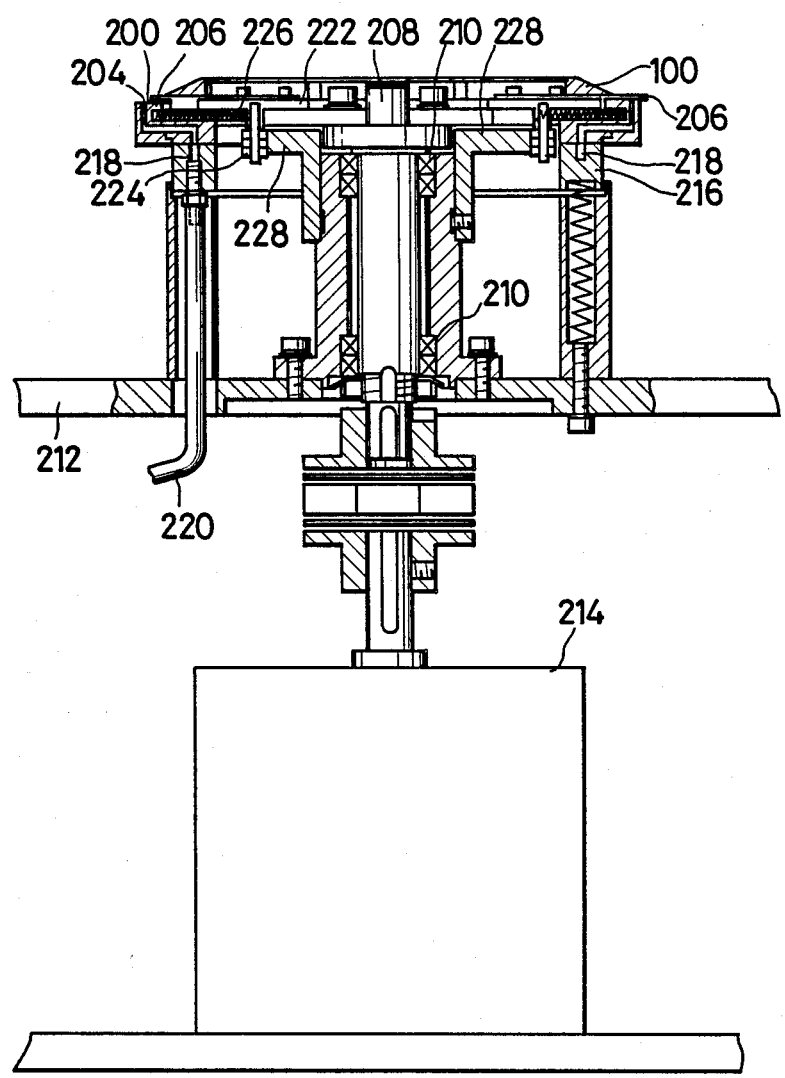
FIG. 15 is a front elevation view in section showing a chip marking apparatus and a mechanism associated with the chip marking apparatus.
Figure 16:
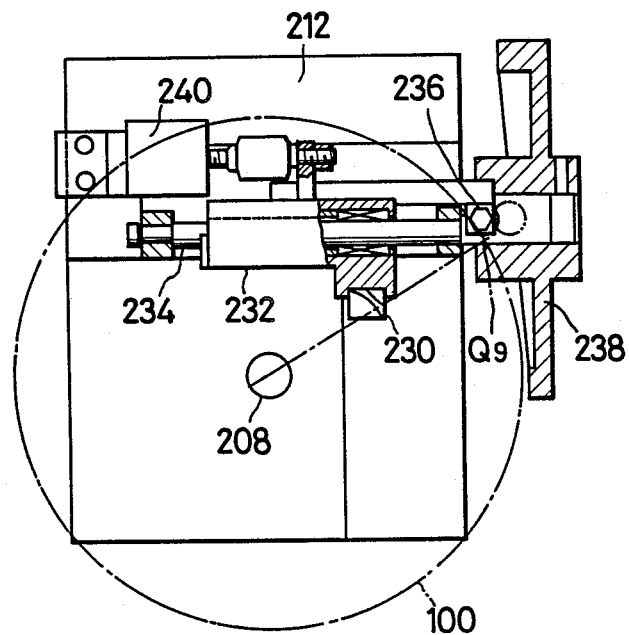
FIG. 16 is a front elevation view in section showing a mechanism for actuating each of the push bars arranged in a first index table.

FIG. 14 shown the first index table 100 of a disc-like shape and FIGS. 15 and 16 show a mechanism associated with the index table 100. The index table 100 includes a flat periphery 200 on which chips 125 are to be put, said flat periphery 200 being formed with chip positioning recesses 202 which are arranged in correspondence to positions $Q_1$ to $Q_{12}$ defined by dividing a circumference of the table 100 into twelve equal parts. Thus, the positioning recesses 202 are arranged at angular intervals of 30 degrees. Also, the periphery 200 of the index table 100 is formed with suction holes 204 in correspondence to the recesses 202. In the illustrated embodiment, each of the suction holes 204 is arranged in the recess 202 corresponding thereto. The index table 100 is also provided with a plurality of radially slidable push rods 206, which are arranged so as to be ejectable with respect to the respective positioning recesses 202. In FIG. 14, only a part of the push rods 206 is shown for clarity of the description.

The so-constructed first index table 100 is fixed on a rotating shaft 208 which is supported through a bearing 210 on a support frame 212, as shown in FIG. 15. Also, the rotating shaft 208 is connected to index means 214 which is adapted to intermittently rotate the index table 100 through the shaft 208 at angular intervals of 30 degrees. The index means 214 may comprises a stepping motor.

On the support frame 212 is arranged an annular member 216 which is formed with an annular suction groove 218 communicated with the suction holes 204 of the index table 100, as shown in FIG. 15. The annular suction groove 218 is connected through a vacuum suction hose 220 to a vacuum pump (not shown). The annular member 216 is contactedly mounted on a lower surface of the index table 100.

The push rods 206 each are mounted on a push rod slider 222 which is provided with a roller 224. The roller 224 is biased by a compression spring 226 so that is may be abutted against a stationary cam 228 fixed on the rotating shaft 208. The stationary cam 228 serves to hold the push rods 206 in a retracted state at the positions $Q_1$ to $Q_8$ shown in FIG. 14. More particularly, the illustrated embodiment is so constructed that actuation of the stationary cam 228 causes supply of a chip from the chip feed apparatus 102 to the index table 100 to be carried out at the position $Q_1$, the chip measuring apparatus 104 to measure electrical characteristics of a chip at the position $Q_4$, and the chip marking apparatus 106 to put a mark or a value of electrical characteristics of a chip or the like on the chip. Electrical characteristics of a chip measured at the position $Q_4$ include, for example, electrostatic capacity of a chip capacitor, resistance of a chip resistor, inductance of a chip inductor and the like. At the position $Q_{11}$, the stationary cam 228 ejects the push rod 206 for the purpose of eliminating a chip defective in electrical characteristics.

At the position $Q_9$, it is required to feed a chip of normal electrical characteristics to the next chip transferring section or apparatus 108 and carry a chip defective in electrical characteristics to the position $Q_{10}$. For this purpose, a movable cam 230 in place of the stationary cam 228 is adapted to be abutted against the roller 224 at the position $Q_9$ as shown in FIG. 16. The movable cam 230 is fixed on a movable slider 232, which is arranged so as to be slidable with respect to a slide guide shaft 234 horizontally fixedly mounted on the support frame 212. On a tip end of the movable slider 232 is mounted a roller 236, which is adapted to be abutted against a rotating cam 238 which generates force required for actuating the movable cam 230 in a direction of ejecting the push rod 206 when the index table 100 is stopped. Between the movable slider 232 and the support frame 212 is connected an air cylinder 240. When the air cylinder 240 is at a retracted position or in a state of detecting a defective chip, the movable cam 230 is kept retracted, so that the roller 236 is spaced from the rotating cam 238. This results in preventing delivery of the chip to the chip transferring section 108 at the position $Q_9$. When the air cylinder 240 is extended, the roller 236 is abutted against the rotating cam 238, so that the movable cam 230 may periodically advance. This causes the cam 230 to eject the push rod 206 when the index table 100 is stopped, resulting in a chip being delivered to the chip transferring apparatus 108 at the position $Q_9$.

Figure 17:
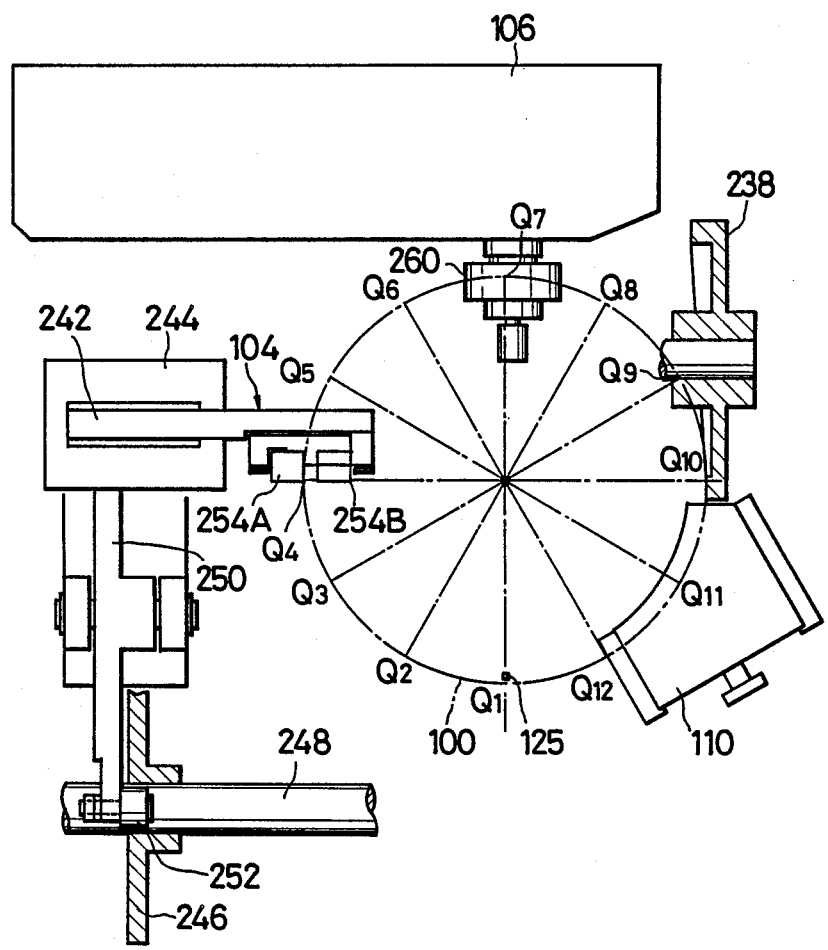
FIG. 17 is a plan view partly in section showing the arrangement of a chip measuring section or apparatus and a chip marking section or apparatus with respect to a first index table.
Figure 18:
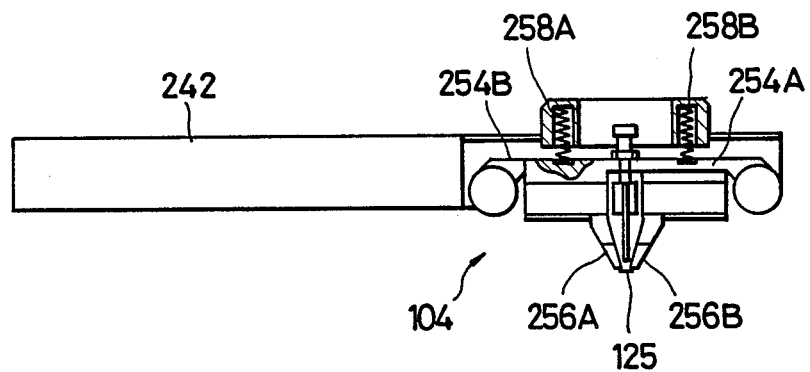
FIGS. 18 and 19 are a front elevation view and a plan view each showing a mechanism for a chip measuring apparatus.
Figure 19:
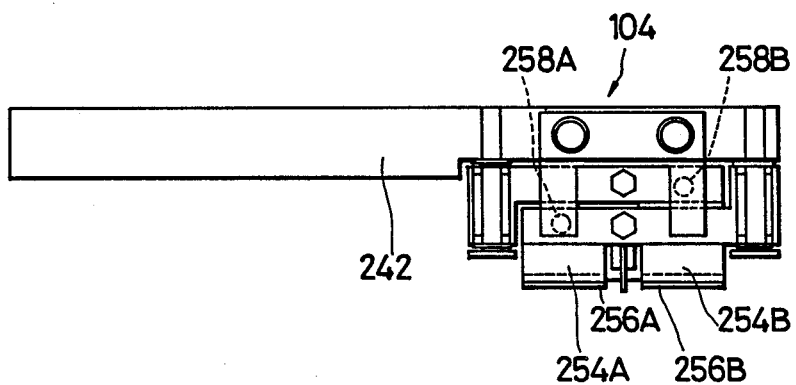

FIGS. 17, 18 and 19 show a mechanical part of the chip measuring section 104, wherein a vertically movable bar 242 is fixed on a vertically movable slider 244 supported on a vertically slidable shaft. Also, a cam 246 is fixed on a rotating shaft 248 and a lever 250 is provided at an end thereof with a roller 252 acting as a cam follower and adapted to be abutted against the cam 246. The lever 250 is connected at the other end thereof to the vertically movable slider 244. Thus, the vertically movable slider 244 and vertically movable bar 242 are vertically moved in synchronism with the first index table 100.

On the vertically movable bar 242, as shown in FIGS. 17 and 18, are pivotally mounted a pair of arms 254A and 254B which have contacts 256A and 256B mounted at tip ends thereof, respectively. The arms 254A and 254B are downwardly forced by compression springs 258A and 258B, respectively.

The vertically movable bar 242 of the chip measuring section 104 is at a raised position and a lowered position while the index table is being rotated and stopped, respectively, so that the contacts 256A and 256B may be abutted against end electrodes provided at both ends of a chip 125 at the position $Q_4$ to measure electrical characteristics of the chip through measuring means (not shown). Electrical characteristics of a chip measured at the position $Q_4$ include, for example, electrostatic capacity of a chip capacitor, resistance of a chip resistor, inductance of a chip inductor and the like.

The chip marking section or means 106, as shown in FIGS. 13 and 17, is adapted to actuate, in association with movement of the index table 100, a roller 260 having various kinds of markings or stamps formed thereon to carry out marking on a chip carried to the position $Q_7$ shown in FIG. 14 by means of an ultraviolet-curing ink or the like. For this purpose, the roller 260 is intermittently rotated with intermittent rotation of the index table 100 at a predetermined cycle to carry out the marking operation. For example, when the chips are a chip capacitor, a chip resistor and a chip inductor, values of electrostatic capacity, resistance and inductance are marked thereon, respectively.

As shown in FIG. 2 a chip detecting sensor 262 is arranged in correspondence to the position $Q_1$ shown in FIG. 14. The sensor 262 is adapted to confirm whether a chip supplied from the chip feed section 102 is on the index table 100 at the position $Q_1$. When the sensor 262 detects a chip at the position $Q_1$, the measuring section is adapted to start the measuring operation or the vertically movable bar 242 is adapted to start its downward movement concurrently with arrival of the chip at the position $Q_4$.

Now, the chip measuring and marking sections constructed as described above will be described hereinafter.

When a chip is supplied from the chip feed section 102 to the first index table 100 at the position $Q_1$, the table 100 holds the chip thereon through the suction hole 204 by suction and the table 100 is intermittently rotated at angular intervals of 30 degrees at a predetermined cycle to transfer the chip. When the chip detecting sensor 262 shown in FIG. 2 detects that a chip is on the index table at the position $Q_1$, the chip measuring section 104 starts the measuring operation upon completion of transfer of the chip from the position $Q_1$ to the position $Q_4$. This results in the measuring section 104 measuring electrical characteristics of the chip at the position $Q_4$ and then the chip marking section 106 carrying out marking on the chip at the position $Q_7$. When measuring by the section 104 determines that the chip is not defective, the movable cam 230 is actuated to eject the push rod 206 at the position $Q_9$, so that the chip may be delivered to the chip transferring section 108.

When measuring section 104 judges that the chip is defective, it is carried through the position $Q_9$ to the position $Q_{11}$, at which time the stationary cam 228 is actuated to eject the push rod 206, resulting in the chip being discharged to the defective chip receiver 110 shown in FIGS. 1 and 2.

As described above, the chip measuring and marking mechanism is adapted to carry out measuring of electrical characteristics of the respective chips and marking of them in order, while the first disc-like index table is intermittently carrying them, to thereby accomplish labor saving and an improvement in efficiency in the operation.

Figure 20:
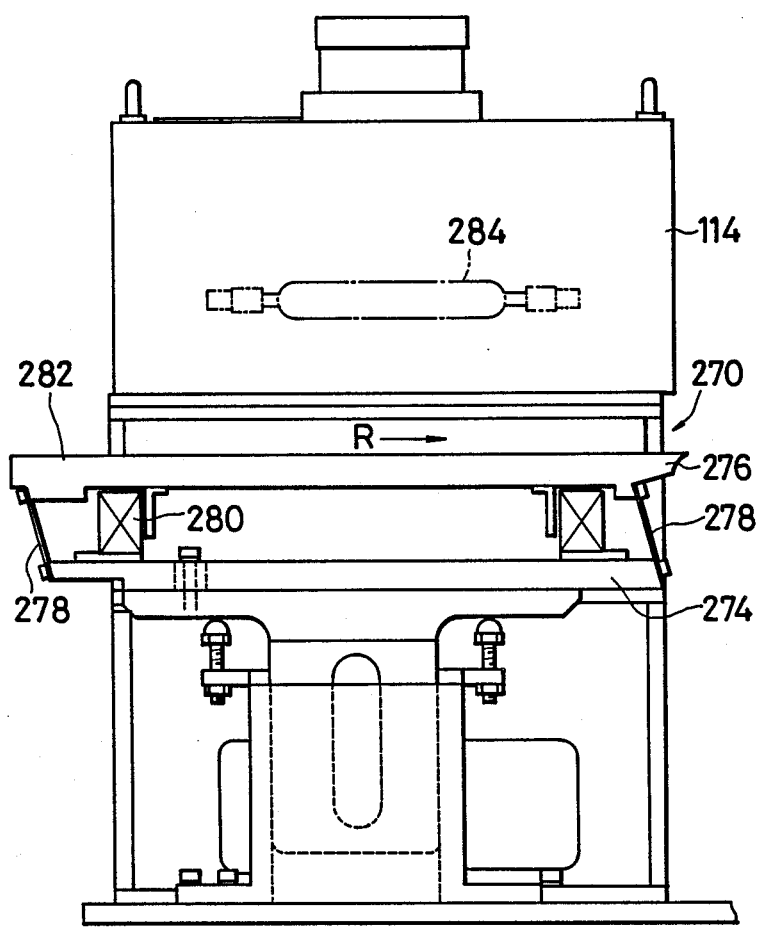
FIG. 20 is a side elevation view showing a vibrating feeder and a chip drying section.

FIG. 20 shows a vibrating feeder 270 constituting a part of the chip transferring section 108 schematically shown in FIG. 1 and connected at one end thereof to the first index table 100. The vibrating feeder 270 is connected at the other end thereof to a belt feeder 272 connected to the second index table 112, as shown in FIG. 1. The vibrating feeder 270, as shown in FIG. 20, includes a base 274, a vibrated table 276 mounted on the base 274 through leaf springs 278, and electromagnets 280 mounted on the base 274 to apply vibration to the vibrated table 276 due to its AC excitation. The vibrated table 276 is formed thereon with a linear groove 282 in which chips are arranged in a row. The vibrating feeder 270 constructed as described above vibrates the vibrated table 276 to move chips received in the linear groove 282 in a row in a direction indicated at an arrow R.

Arranged above the vibrating feeder 270 is the chip drying section 114, which may include an ultraviolet light generator 284 when the chip marking section 106 uses an ultraviolet curing ink. This results in the chip drying section 114 irradiating ultraviolet rays to a chip to dry a mark put thereon while it is travelling through the vibrating feeder 270. The dried chip is then transferred to the belt feeder 272. In the illustrated embodiment, the belt feeder 272 includes a timing belt as described hereinafter.

Figure 21:
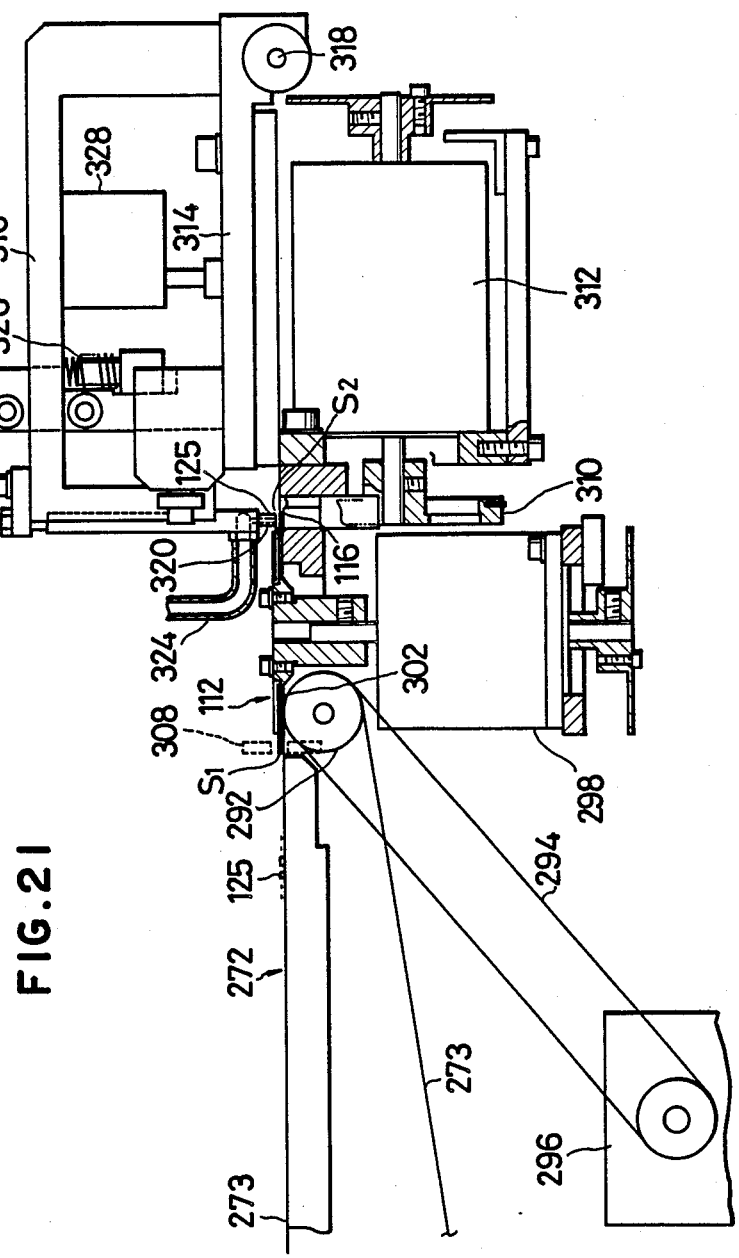
FIGS. 21 and 22 are a side elevation view in section and a plan view each showing a chip taping or arranging section.
Figure 22:
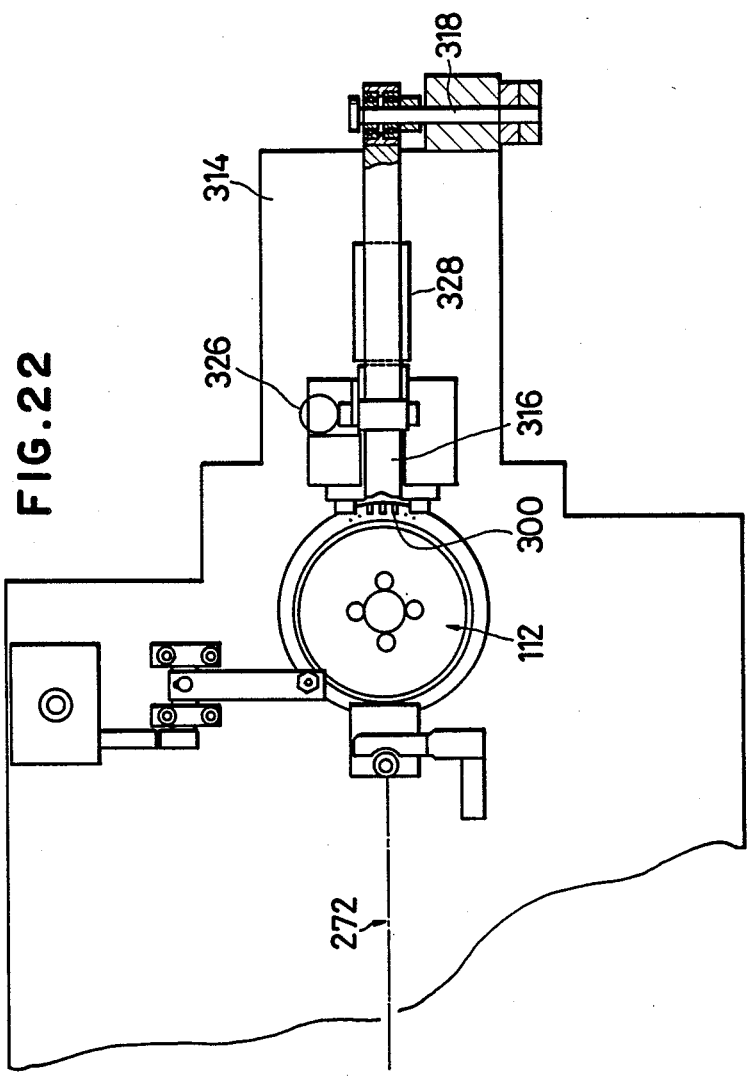
Figure 25:
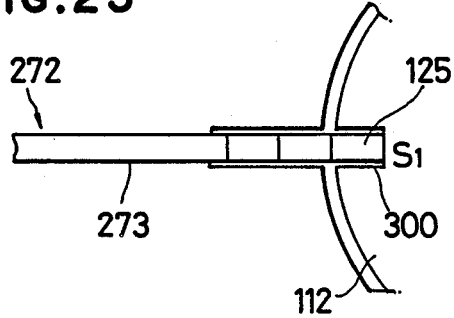
FIGS. 25 and 26 each are a schematic view showing operation of a second index table.

FIGS. 21 and 22 show the chip taping section or chip arranging section 118 which is adapted to arrange chips one by one and in series in a tape. In the illustrated embodiment, the chip taping or arranging section 118 may include the second index table or taping index table 112. The above-described belt feeder 272 is connected to the taping index table 112 to supply chips thereto one by one. As described above, the belt feeder 272 includes a timing belt 273 (FIG. 25). The timing belt 273 is stretchedly arranged between a belt pulley 292 and another belt pulley (not shown) and the belt pulley 292 is connected through a transmission belt 294 to a motor 296, resulting in chips put on the timing belt 290 being successively supplied to the taping index table 112 one by one.

Figure 23:
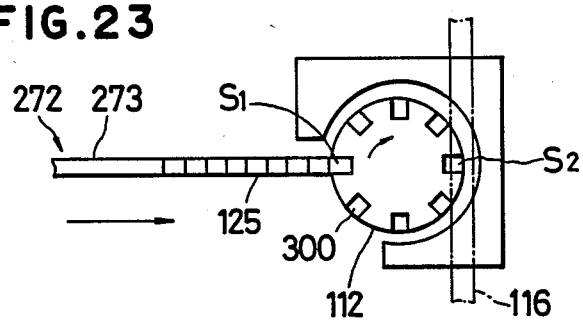
FIG. 23 is a schematic plan view showing a second index table for a chip arranging section.
Figure 24:
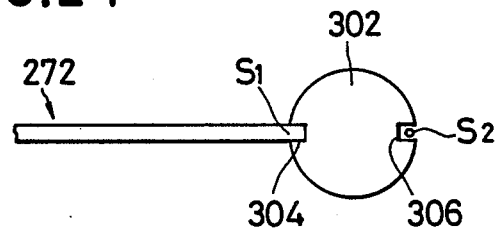
FIG. 24 is a schematic plan view showing a stationary receiving plate arranged under a second index table.

The second index table 112 of a disc-like shape is intermittently turned by a stepping motor 298 as shown in FIG. 21 and formed with a plurality of grooves 300 at equal intervals for receiving chips 125 therein as shown in FIG. 23. Under the index table 112 is fixedly arranged a receiving plate 302 of a substantially circular shape as shown in FIG. 24. The receiving plate 302 is formed with a cutout 304 at a chip receiving position $S_1$ thereof for receiving a chip 125 from the timing belt 273 and a cutout 306 at a chip delivery position $S_2$ for supplying a chip to the tape 116 having chip receiving recesses or bores formed thereon at equal intervals. Portions of the receiving plate 302 interposed between the positions $S_1$ and $S_2$ serve as a bottom for the chip receiving grooves 300 of the index table 112 to support a bottom surface of a chip 125 received in each of the grooves 300 thereon.

Figure 26:
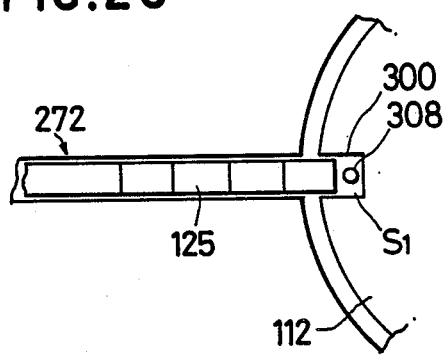

Transfer of chips by means of the second index table 112 constructed as described above is successfully carried out when each of the chips carried by the timing belt 273 is received deep in the recess 300 as shown in FIG. 25. However, when the index table 112 is turned while a chip 125 is incompletely received in the recess 300 as shown in FIG. 26, breakage or the like occurs to the chip to damage it. In order to eliminate such a problem, a chip detecting photosensor 308 comprising a light emitter and a light receptor is arranged at the position $S_1$ as shown in FIGS. 21 and 26, to thereby confirm, prior to turning of the second index table 112, whether a chip 125 is properly received in each of the grooves 300.

As shown in FIGS. 21 and 23, the tape 116 formed with the chip receiving recesses or holes at equal intervals is adapted to intermittently travel in proximity to the index table 112 and under the index table 112 at the position $S_2$. For this purpose, a pitch feed wheel 310 which is arranged so as to be engaged with the tape 116 is intermittently turned by means of a stepping motor 312 to intermittently feed the tape a predetermined amount at a time.

Figure 27:
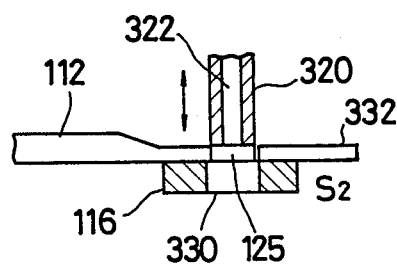
FIGS. 27 to 29 each are a schematic view showing operation of a suction pin.

The chip taping section 118, as shown in FIGS. 21 and 22, also includes a frame 314, on which a vertically movable arm 316 of a substantially inverted L-shape is supported through a pivot shaft 318. On a tip end of the vertically movable arm 316 is fixedly mounted a suction pin 320 which is arranged in positional correspondence to the position $S_2$ of the index table 112 and of which a lower end is substantially flush with the index table 112. The suction pin 320, as shown in FIG. 27, has a suction hole 322 formed therethrough, so that it may hold a chip thereon by vacuum suction force provided through the suction hole 322. For this purpose, the suction pin 320 is connected through a vacuum suction hose 324 (FIG. 21) to a vacuum pump (not shown).

A compression spring 326 is arranged so as to act on the vertically movable arm 316 to constantly upwardly force the tip end of the arm 316. Downward movement of the tip end is carried out by means of a solenoid 328. The vertically movable arm 316 is adapted to be lowered in synchronism with stopping of the index table 112.

The belt feeder 272 is adapted to continuously travel to receive thereon chips which have been marked and dried and continuously supply them to the second index table 112 at the position $S_1$.

When the chip detecting photosensor 308 detects that a chip 125 is properly received in the chip receiving groove 300 of the index table 112 at the position $S_1$ as shown in FIG. 25, the stepping motor 298 is actuated to turn the second index table 112 by a predetermined angle. Thus, chips 125 are separated one by one at every intermittent movement of the second index table 112 and carried toward the position $S_2$ in turn.

Figure 28:
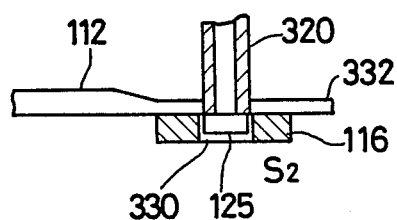

Suction force is continuously applied to the suction pin 320 through the suction hole 322; accordingly, when a chip 125 is carried to the position $S_1$ due to intermittent movement of the index table 112 as shown in FIG. 27, the suction pin 320 holds the chip thereon by vacuum suction as shown in FIG. 27 and is lowered to a position shown in FIG. 28 to place the chip in the recess or hole of the tape 116 while the tape is being stopped as shown in FIG. 28. In FIGS. 27 and 28, the recess of the tape 116 is designated by reference numeral 330, and reference numeral 332 indicates a tape guide.

Figure 29:
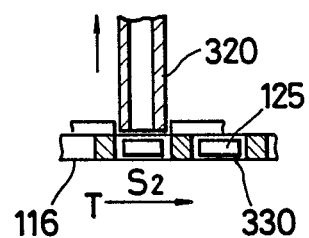

Then, the tape 116 is moved by a distance corresponding to an interval between the recesses 330 and the chip 125 is forcibly separated from the suction pin 320 due to movement of the tape 116 as shown in FIG. 29. The suction pin 320 from which the chip is removed is then returned from the position of FIG. 29 to a raised position shown in FIG. 27. Moving of the tape 116 causes the next empty recess 330 to be at the position $S_2$ and the above-described operation is repeated to receive another chip in the next recess 330.

The tape of which the recesses are filled with chips may be covered with a cover tape according to a conventional procedure.

As described above, the chip taping or arranging section or apparatus includes the second index table formed with the chip receiving grooves of a shape corresponding to that of a chip at equal intervals so as to receive chips from the chip transferring section therein and intermittently turned to carry the chips, the photosensor for detecting whether a chip is fully or properly received in each of the chip receiving grooves, the vertically movable arm lowered at every stop of the index table, the suction pin mounted at the tip end of the vertically movable arm so as to hold a chip thereon by vacuum suction to place it in the recess of the tape, and the pitch feed wheel for intermittently moving the tape. Such construction permits arrangement of chips in the tape to be automatically and efficiently accomplished and prevents damage of chips.

As can be seen from the foregoing, the system of the present invention includes the first index table intermittently turned, the chip feed section for supplying chips one by one to the first index table, the chip measuring section for measuring electrical characteristics of a chip carried by the first index table, the chip marking section for putting a mark on a chip carried by said first index table, the second index table intermittently turned, the chip transferring means arranged between the first index table and the second index table to transfer to the second index table normal chips supplied from the first index table thereto, the mark drying means arranged at said chip carrying means to dry a mark put on a chip at the chip marking section, and a suction pin for sucking up a chip carried by the second index table to place it in a recess of a tape. Accordingly, the system of the present invention automatically practices measuring of electrical characteristics of a chip, application of a mark onto a chip, drying of the mark, and arrangement of a chip in a tape in order. Also, the system of the present invention automatically removes or eliminates any defective chip therefrom. Thus, it will be noted that the present invention exhibits good reliability in operation and accomplishes labor saving.

It will thus be seen that the objects set forth above, among those made apparent from the preceding description, are efficiently attained and, since certain changes may be made in the above construction without departing from the spirit and cope of the invention, it is intended that all matter contained in the above description or shown in the accompanying drawings shall be interpreted as illustrative and not in a limiting sense.

What is claimed is:

1. A system for arranging chips in series comprising:
   a first index table of a disc-like shape intermittently turned and formed with chip receiving grooves at equal intervals;
   a chip feed section for supplying chips one by one to said first index table;
   a chip measuring and marking mechanism for measuring electrical characteristics of each of the chips successively carried by said first index table and putting a mark on a chip measured;
   a second index table of a disc-like shape intermittently turned and formed with chip receiving grooves at equal intervals;
   chip transferring means arranged between said first index table and said second index table for successively transferring normal chips delivered from said first index table to said second index table; and
   a chip arranging section provided in proximity to said second index table to successively take out chips from said second index table and arrange the chips in series in a tape by vacuum suction.

2. A system as defined in claim 1 further comprising mark drying means intermediately arranged at said chip carrying means.

3. A system as defined in claim 1, wherein said chip feed section includes a chip separating mechanism for individually separating chips and detecting a chip defective in configuration and means for removing said defective chip.

4. A system as defined in claim 1, wherein said first index table includes defective chip eliminating means for eliminating a chip defective in electrical characteristics detected at said chip measuring and marking mechanism, said defective chip eliminating means being arranged at a position which is not associated with said chip transferring means.

5. A system as defined in claim 1, wherein said chip feed section comprises a linear feeder formed with an aligning groove for arranging a plurality of chips delivered from a chip source in a row;
   a separation slider formed with a separation groove which is connected to said aligning groove of said linear feeder when said separation slider is in a state capable of accepting a chip;
   an insertion guide formed with a guide groove which is connected to said separation groove when said separation slider is in a state capable of separating chips;
   a pusher for pushing out a chip received in said separation groove to said guide groove; and
   suction means for removing a chip defective in configuration by suction when said chip defective in configuration is in said separation groove to interfere with movement of said separation slider.

6. A system as defined in claim 5, wherein said suction means comprises a suction pin.

7. A system as defined in claim 5, wherein said linear feeder includes an air jet nozzle for blowing air against chips arranged in said aligning groove in a chip advancing direction.

8. A system as defined in claim 1, wherein said chip measuring and marking mechanism comprises a chip measuring section for measuring electrical characteristics of each of the chips carried by said first index table and a chip marking section for putting a mark on a chip measured at said chip measuring section;
   said chip measuring section and chip marking section being arranged around said first index table;
   said first index table including a plurality of push rods slidably arranged on said first index table so as to be slidable in a radial direction of said first index table, so that a chip defective in electrical characteristics detected at said chip measuring section may be eliminated by actuation of each of said push rods at a position which is not associated with said chip transferring means.

9. A system as defined in claim 8, wherein said chip measuring section includes a pair of arms pivotally mounted on a vertically movable bar arranged so as to be vertically moved in synchronism with intermittent movement of said first index table;

said arms each being provided at a tip end thereof with a contact which is contacted with each of end electrodes of a chip.

10. A system as defined in claim 1, wherein said chip arranging section comprises a photosensor for detecting the location of each of the chips delivered from said chip transferring means in each of said chip receiving grooves of said second index table;

a vertically movable arm lowered when said second index table is stopped;

a suction pin mounted on a tip end of said vertically movable arm for holding chips thereon in turn and arranging them in said tape by suction; and a pitch feed wheel for intermittently moving said tape.

11. A system as defined in claim 1, wherein said chip transferring means comprises a vibrating feeder connected at one end thereof to said first index table and a belt feeder connected at one end thereof to the other end of said vibrating feeder and at the other end thereof to said second index table.

12. A system as defined in claim 11, wherein said belt feeder comprises a timing belt.

13. A chip feed apparatus comprising:

a linear feeder formed with an aligning groove for arranging a plurality of chips delivered from a chip source in a row;

a separation slider formed with a separation groove which is connected to said aligning groove of said linear feeder when said separation slider is in a state capable of accepting a chip;

an insertion guide formed with a guide groove which is connected to said separation groove when said separation slider is in a state capable of separating chips;

a pusher for pushing out a chip received in said separation groove to said guide groove; and suction means for removing a chip defective in configuration by suction when said chip defective in configuration is in said separation groove to interfere with movement of said separation slider.

14. A chip arranging apparatus for arranging chips on a tape in series comprising:

a disc-like index table intermittently turned and formed with chip receiving grooves at equal intervals, said index table carrying chips delivered from the chip transferring means;

a photosensor for detecting location of a chip delivered from said chip transferring means in each of said chip receiving grooves of said index table;

a vertically movable arm lowered when said index table is stopped;

a suction pin mounted on a tip end of said vertically movable arm for holding chips thereon in turn by suction and arranging them on a tape; and a pitch feed wheel for intermittently moving said tape.

* * * * *